United States Patent [19]
Mohsen

[11] Patent Number: 5,432,708
[45] Date of Patent: Jul. 11, 1995

[54] MULTICHIP MODULE INTEGRATED CIRCUIT DEVICE HAVING MAXIMUM INPUT/OUTPUT CAPABILITY

[75] Inventor: Amr Mohsen, Saratoga, Calif.

[73] Assignee: Aptix Corporation, San Jose, Calif.

[21] Appl. No.: 958,872

[22] Filed: Oct. 8, 1992

[51] Int. Cl.[6] .......................................... H03K 17/693
[52] U.S. Cl. .................................. 364/490; 364/489; 364/488
[58] Field of Search ............... 364/488, 489, 490, 491, 364/716; 340/825.83; 307/465

[56] References Cited

U.S. PATENT DOCUMENTS

| | | | |
|---|---|---|---|
| 5,231,588 | 7/1993 | Agrawal et al. | 364/489 |
| 5,233,539 | 8/1993 | Agrawal et al. | 364/489 |
| 5,253,181 | 10/1993 | Marui et al. | 364/489 |
| 5,295,082 | 3/1994 | Chang et al. | 364/490 |

OTHER PUBLICATIONS

Gulett, "Monolithic of Multichip?", ASIC Technology, May, 1992, pp. 24–26.
Dobbelaere, et al., "Peripheral Circuit Design for Field Programmable MCM Systems", IEEE, <Apr. 15, 1992, pp. 119–122.

*Primary Examiner*—Vincent N. Trans
*Attorney, Agent, or Firm*—D'Alessandro & Ritchie

[57] ABSTRACT

A high I/O count integrated circuit is disposed on a semiconductor chip having opposing faces and comprises a plurality of functional circuit modules, each having inputs and at least one output having a first drive capability. A plurality of a first type of I/O nodes, each comprising a first conductive structure is disposed in a first I/O node array on the surface of a first one of the semiconductor chip faces. A plurality of a second type of I/O nodes, each comprising a first conductive structure is disposed on the first semiconductor chip face. An interconnect architecture comprising a plurality of conductors is superimposed on the functional circuit modules, the interconnect architecture comprises a plurality of interconnect conductors. Selected ones of the interconnect conductors are connectable to the inputs and at least one output of selected ones of the functional circuit modules by electrically programmable user-programmable interconnect elements. Selected ones of the interconnect conductors are connectable to other selected ones of the interconnect conductors by user-programmable interconnect elements. Selected ones of the interconnect conductors are connectable to the first I/O nodes by electrically programmable user-programmable interconnect elements. Selected ones of the interconnect conductors are connectable to the second I/O nodes by electrically programmable user-programmable interconnect elements.

4 Claims, 3 Drawing Sheets

MULTICHIP MODULE INTEGRATED CIRCUIT DEVICE HAVING MAXIMUM INPUT/OUTPUT CAPABILITY

BACKGROUND OF THE INVENTION

1. Field of the Invention

The present invention relates to integrated circuit devices. More particularly, the present invention relates to high input/output (I/O) count integrated circuit devices suitable for use in multichip module (MCM) configurations and which incorporate two different types of input/output (I/O) nodes, a first type having high current drive capability for driving off-chip signals and a second type comprising externally accessible internal nodes of the integrated circuit having low current drive capability for driving signals to externally-accessible internal nodes of neighboring integrated circuits on an MCM substrate. The integrated circuit devices may include logic or other function circuit modules and may also include programmable interconnect structures.

2. The Prior Art

Commercial integrated circuits have recently begun to become I/O limited. That is, that a present limitation on integration, other than the die size limitation which restricts the number of active devices disposed upon a substrate, is that I/O requirements of some otherwise integrable circuits have begun to exceed the number of I/O nodes, i.e., external pins which can be provided for a given integrated circuit device. For example, field programmable gate array (FPGA) devices presently have gate densities in the 1K to 8K gate range. I/O capability of these devices is limited by several factors. Commercial packages such as DIP, QFP and Pin Grid array (PGA) rely on wire bonding techniques in which the I/O have to be placed on the periphery of the chip. The periphery of the FPGA chip can support only a limited number of I/O pads dictated by the available peripheral area of the integrated circuit die.

In addition, FPGA products are designed to have I/O buffers capable of driving 50 pF loads normally seen in printed circuit board environments. The power dissipation design requirements of these high-drive I/O buffers constrains the number of I/O nodes possible on any FPGA chip due to power dissipation limits dictated by the package thermal resistance.

Recent applications of reprogrammable FPGAs to emulate high gate count ASICs have shown that available partitioning algorithms for automatically partitioning ASIC designs into FPGAs are constrained mainly by low gate utilization, i.e., an inability to utilize fully the available internal gates on the integrated circuit. This inefficiency results from the relatively low I/O capability of commercial FPGAs. For example, a 3090 integrated circuit manufactured by Xilinx of San Jose, California has 140 I/O nodes and can be used to map 250 to 500 gates only with automatic partition algorithms. However the Xilinx 3090 FPGA device can accommodate more than 3,000 gates. This plainly represents an inefficiency of about a factor of 10.

It would be very desirable to provide an integrated circuit architecture having about 10 times the I/O capability of presently available commercial ICs (a few hundreds to a few thousands of I/O nodes). This will enable building, for example, reprogrammable ASIC devices having gate counts greater than 10,000, i.e., 100,000 gates, more economically and at a much higher performance.

BRIEF DESCRIPTION OF THE INVENTION

According to a first aspect of the present invention, a high I/O count integrated circuit device suitable for use in multichip module (MCM) configurations is provided. The integrated circuit device of the present invention may include an array of functional circuits, each of which includes a plurality of inputs and at least one output. The output of each functional circuit is capable of driving a relatively small load of, for example, 5 pF. A programmable interconnect architecture comprising interconnectable conductors is superimposed on the functional circuit array. Direct connections to the inputs and outputs of the functional circuits are provided via access conductors associated with the interconnect architecture and which incorporate two different types of input/output (I/O) nodes, one having high current drive capability for driving off-chip signals with larger load capacitances, i.e., 50 pF, and one having low current drive capability for driving signals to externally accessible internal nodes of neighboring chips.

According to a second aspect of the present invention, a plurality of high I/O count integrated circuits according to the present invention are disposed on a multichip module (MCM) substrate. A plurality of field programmable interconnect components, such as those designated AX1024-R FPICs, available from Aptix Corporation of San Jose, Calif., which may be used to interconnect the low-current drive I/O pads of the high I/O count integrated circuits to one another are also disposed on the substrate. Hardwired connections are made between the programmable interconnect devices and the low-current drive I/O nodes of the high I/O count integrated circuits.

According to a third aspect of the present invention, the high I/O count integrated circuit device of the present invention may be combined on a single MCM module with a programmable interconnect structure.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The present invention comprises a novel architecture for a very high I/O density integrated circuit for an MCM substrate. The high I/O density integrated circuit of the present invention is characterized by much higher speed and better cost economics than has been previously possible.

Figure 1:
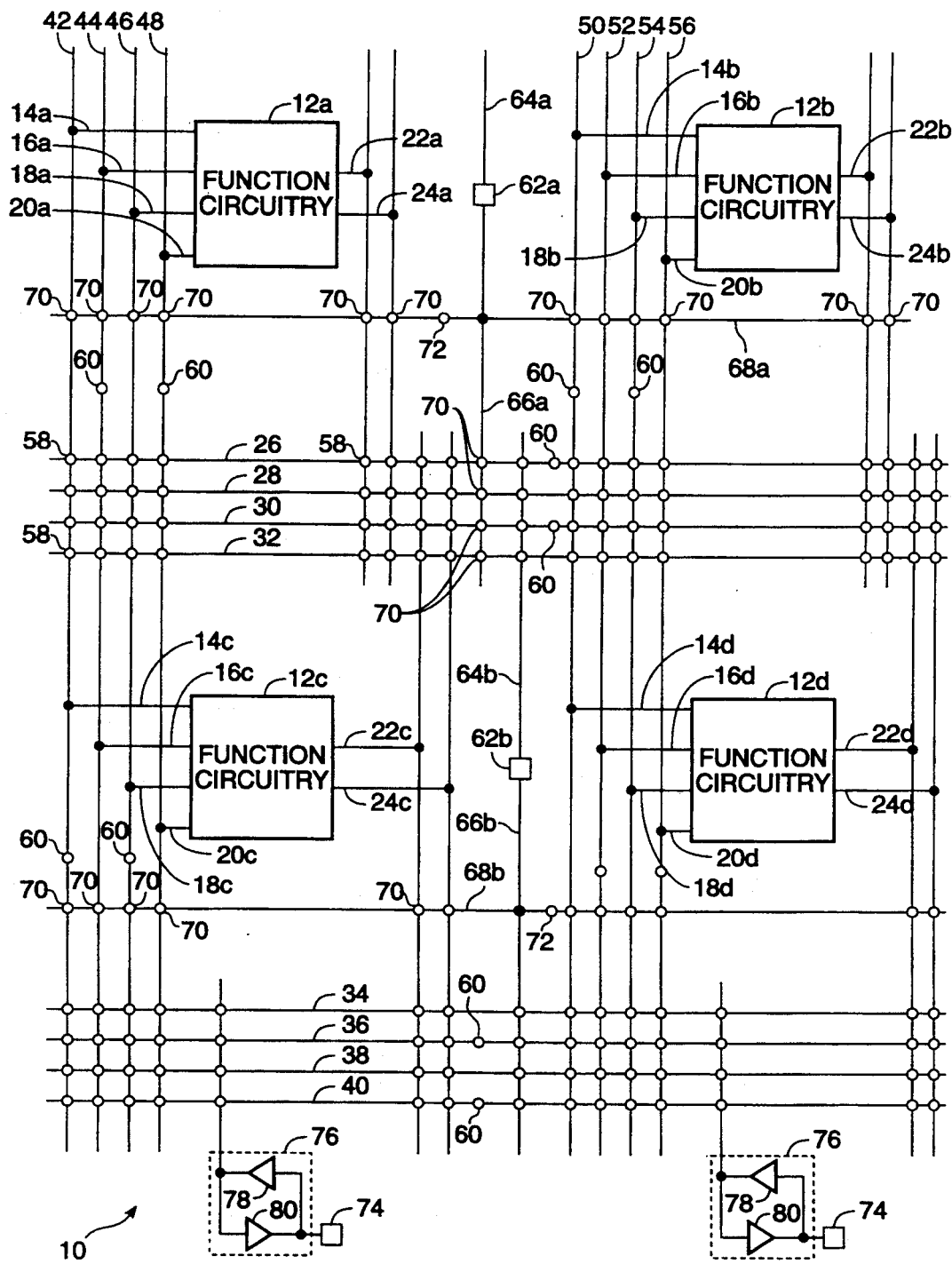
FIG. 1 is a block diagram of a high I/O count integrated circuit according to a presently preferred embodiment of the invention.

As illustrated in FIG. 1, the architecture of a high I/O count integrated circuit 10 according to the present invention comprises an array of rows and columns of function circuits 12a to 12d. For simplifying the illustration of the concept of the present invention an array of only two rows and two columns is shown, but those of ordinary skill in the art will recognize that an arbitrarily sized array is possible. As depicted in FIG. 1, each function circuit has a plurality of inputs, shown at reference numerals 14a–14d, 16a–16d, 18a–18d, and 20a–20d and at least one output. Two outputs 22a–22d and 24a–22d are shown for function circuits 12a–12d. For purposes of illustration only, the function circuits may be thought of as logic function circuits, such as are found in presently-available FPGA devices. Those of ordinary skill in the art will recognize that this in no way limits the disclosure and that the present invention relates to high I/O count integrated circuits and such circuits generally adapted for MCM use.

An interconnect architecture is superimposed upon the function circuit array of the present invention. The inputs and outputs of the function circuits 12a–12d are connected to access conductors within the interconnect architecture superimposed on the function circuit array. In a preferred embodiment, the interconnect architecture comprises a network of individual conductors which may be programmably connected to one another and to the inputs and outputs of the function circuits by programming user programmable interconnect elements. The structure and use of such elements, in both reprogrammable and one-time programmable form is well known to those of ordinary skill in the art.

Accordingly, FIG. 1 shows a network of horizontal and vertical interconnect conductors. Horizontal interconnect conductors 26, 28, 30, and 32 are disposed below the first row of function circuits 12a and 12b, and horizontal interconnect conductors 34, 36, 38, and 40 are disposed below the second row of function circuits 12c and 12d. Similarly, vertical interconnect conductors 42, 44, 46, and 48 are disposed to the left of the first column of function circuits 12a and 12c, and vertical interconnect conductors 50, 52, 54, and 56 are disposed to the left of the second column of function circuits 12b and 12d.

Some of the programmable interconnect elements are used to connect intersecting horizontal and vertical interconnect conductors. Illustrative ones such interconnect elements are shown as circles at reference numerals 58. Other ones of the programmable interconnect elements are used to connect segmented horizontal and vertical interconnect conductors as illustratively shown at reference numerals 60. The embodiment of FIG. 1 shows an illustrative use of such interconnect elements. Those of ordinary skill in the art will recognize that this embodiment is not meant to show a preferred methodology for interconnecting such conductors, but merely to illustrate the possibilities of such interconnect design.

According to a presently preferred embodiment of the invention, the outputs of the function circuits can be connected to a first type of I/O node to drive relatively small loads, for example 5 pF on chip or on another high I/O count integrated circuit device located on the same MCM substrate through the interconnect architecture as will be explained more fully herein. In addition, using the interconnect architecture of the present invention, the outputs of the function circuits can be connected to a second type of I/O node to drive a larger load, for example standard off-chip 50 pF loads, through suitable I/O buffer amplifiers located on the integrated circuit.

To this end, an array of internal I/O pads, illustrated by representative I/O pads 62a and 62b are organized in an X-Y array. In an actual embodiment according to the present invention, there may be many (i.e., a few hundred to a few thousand) such pads distributed throughout the array. An associated horizontal or an associated vertical access conductor or both are associated with each internal I/O pad 62a and 62b. Thus internal I/O pad 62a is associated with vertical access conductors 64a and 66a and horizontal conductor 68a. Similarly, internal I/O pad 62b is associated with vertical access conductors 64b and 66b and horizontal access conductor 68b.

The vertical access conductors 64a, 66a, 64b and 66b and the horizontal access conductors 68a and 68b are connectable to the interconnect architecture of the present invention. As illustrated in FIG. 1, the internal I/O pads 62a and 62b have access to the horizontal and vertical interconnect conductors via programmable interconnect elements shown at reference numerals 70. In addition, as shown by programmable elements 72, the access conductors for the internal I/O pads 62a and 62b may also be segmentable.

According to another aspect of the present invention, peripheral I/O pads 74, connected to high current drive buffers (shown within dashed lines 76) are provided on the periphery or within the array of the high I/O count integrated chip. The I/O pads 74 are also provided with bumps for flip-chip mounting. The high-current buffers 76 comprise conventional bi-directional buffers (reference numerals 78 and 80) which are sized to drive relatively large external loads.

The internal I/O pads 62a and 62b preferably comprise bumps on the bottom surface of the integrated circuit chip, such as solder bumps for flip-chip mounting. In order to provide a maximum number of such bumps, they may be laid out in an area array on one face of the integrated circuit die. The high-drive I/O pads 74 may also comprise bumps. The high-drive I/O pad bumps are preferably laid out around the periphery of the contacting face of the integrated circuit die but may also be disposed within the array. Those of ordinary skill in the art may readily conceive of alternative I/O pad layouts.

Figure 2:
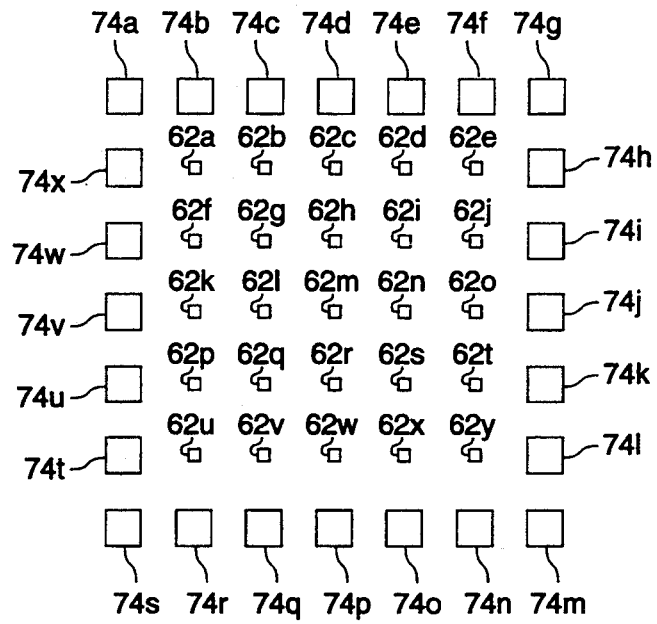
FIG. 2 is a diagrammatic top view of a high I/O count integrated circuit according to the present invention, showing both internal low-current drive I/O pads and peripheral high-current drive I/O pads.

Referring now to FIG. 2, a bottom view of an integrated circuit according to the present invention shows internal I/O connection bumps (shown diagrammatically as squares 62a–62y) in an area array on the bottom of the chip and the peripheral high current drive I/O connection bumps (shown diagrammatically as squares 74a–74x), along with power supply and other interface nodes as additional peripheral bumps on the chip contact face periphery.

Figure 3:
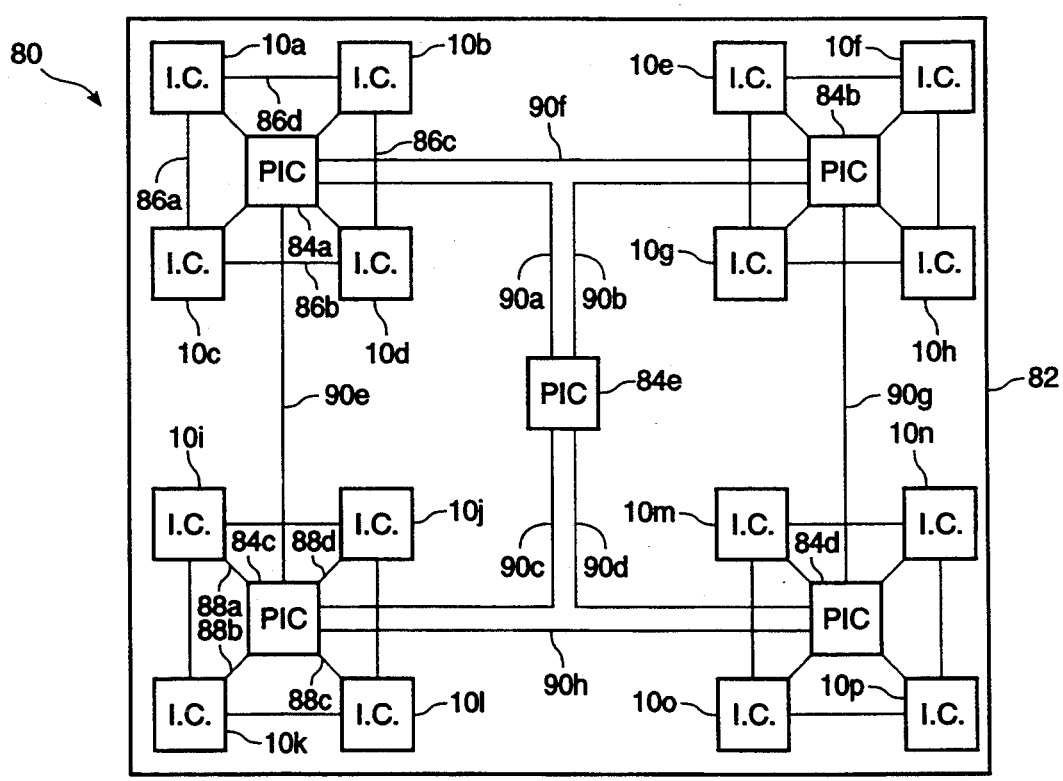
FIG. 3 is a diagrammatic top view of an illustrative multichip module (MCM) substrate including a plurality of high I/O count integrated circuit devices according to the present invention and including programmable interconnect devices which may be used to interconnect the low-current drive I/O pads of the high I/O count integrated circuits to one another.

According to another aspect of the present invention illustrated in FIG. 3, a hierarchical array 80 comprises a plurality of high I/O count integrated circuits 10a–10p mounted on a MCM substrate 82 together with an optional plurality of programmable interconnect circuits 84a–84d. The optional programmable interconnect circuits 84a–84d may be either one-time programmable or re-programmable, and may be, for example, AX1024-R FPIC components manufactured by Aptix Corporation of San Jose, Calif. In the arrangement shown in FIG. 3, four groups of four high I/O count integrated circuits are shown. One programmable interconnect circuit is shown connecting each group of four high I/O count integrated circuits and one or more additional programmable interconnect circuits 84e is shown for use in making interconnections between the four groups. Those of ordinary skill in the art will recognize that the arrangement shown in FIG. 3 is illustrative and not limiting, and that other arrangements are possible which remain within the scope of the teachings of the present invention.

A set of interconnecting conductors disposed on the MCM substrate mate with the mounting bumps on the high I/O count integrated circuits and the programmable interconnect circuits and are used to conduct signals between these devices. The interconnections are shown as single lines, for example, lines 86a–86d connect high I/O count integrated circuits 10a–10d together as shown. Those of ordinary skill in the art will recognize that, for simplicity, lines 86a–86d have been shown as single lines and that any one line 86a–86d may in actuality comprise a plurality of lines connecting together a selected number of I/O pads 62a–62y of one individual high I/O count integrated circuit to a selected number of I/O pads 62a–62y of another high I/O count integrated circuit. Further, lines 88a–88d are shown connecting programmable interconnect circuit 84c to high I/O count integrated circuits 10i–10l. Like lines 86a–86d, those of ordinary skill in the art will recognize that these lines may in fact comprise a plurality of interconnect lines making connections between selected I/O bumps of programmable integrated circuits and high I/O count integrated circuits.

Finally, lines 90a–90h may be used to make connections between programmable interconnect circuits 84a–84e. Those of ordinary skill in the art will recognize that lines 90a–90h may also comprise a plurality of interconnect lines making connections between selected I/O bumps of programmable integrated circuits 84a–84e.

The programming elements on each high I/O count integrated circuit can be electrically programmed to connect together the inputs and outputs of the various functional circuits on the chip. In addition, these programming elements may be used to connect these inputs and outputs to the array of internal I/O pads for connection to the inputs and outputs of the other high I/O count integrated circuits mounted on the MCM using the programmable interconnect circuits mounted on the MCM.

The peripheral I/O pads 74 of the high I/O count integrated circuit are used to make connections to the external world or drive multiple inputs of high I/O count integrated circuits. Any signal that will be connected to the external pins of the MCM is buffered through the peripheral I/O pads 74 of the high I/O count integrated circuit of the present invention. This provides the sufficient current to drive the large capacitance on the printed circuit board.

The capacitance levels of nets on the MCM are quite low (~3 pF/inch). Hence the relatively weak output of the function circuit module can drive the capacitive load connected to the internal pad and the MCM net and segment track on the high I/O count integrated circuits. The low drive of the output of the function circuit modules allows many internal pads (few hundreds to few thousands) to be placed on each high I/O count integrated circuit chip within reasonable power constraints.

Mounting the high I/O count integrated circuits on the MCM substrate allows driving nets between the internal pads of the various high I/O count integrated circuits with the low drive capabilities of the function circuit modules at high speed without I/O buffers. For example 4 pF on a 500Ω output impedance gives a rise time of 2 n sec. The MCM external pads are driven by the high current drives of the peripheral pads. A much higher gate utilization of the high I/O count integrated circuit with automatic partitioning tools is possible, such as a few thousand gates per chip. This enables a much higher speed of operation for ASIC designs mapped to this architecture because more of the critical speed path maps within fewer numbers of integrated circuits.

According to an alternate embodiment of the present invention, the programmable interconnect circuits are merged together with the high I/O count integrated circuits to provide a high I/O count integrated circuit and interconnection array. Such an embodiment is illustrated in FIG. 4 in block diagram form.

Figure 4:
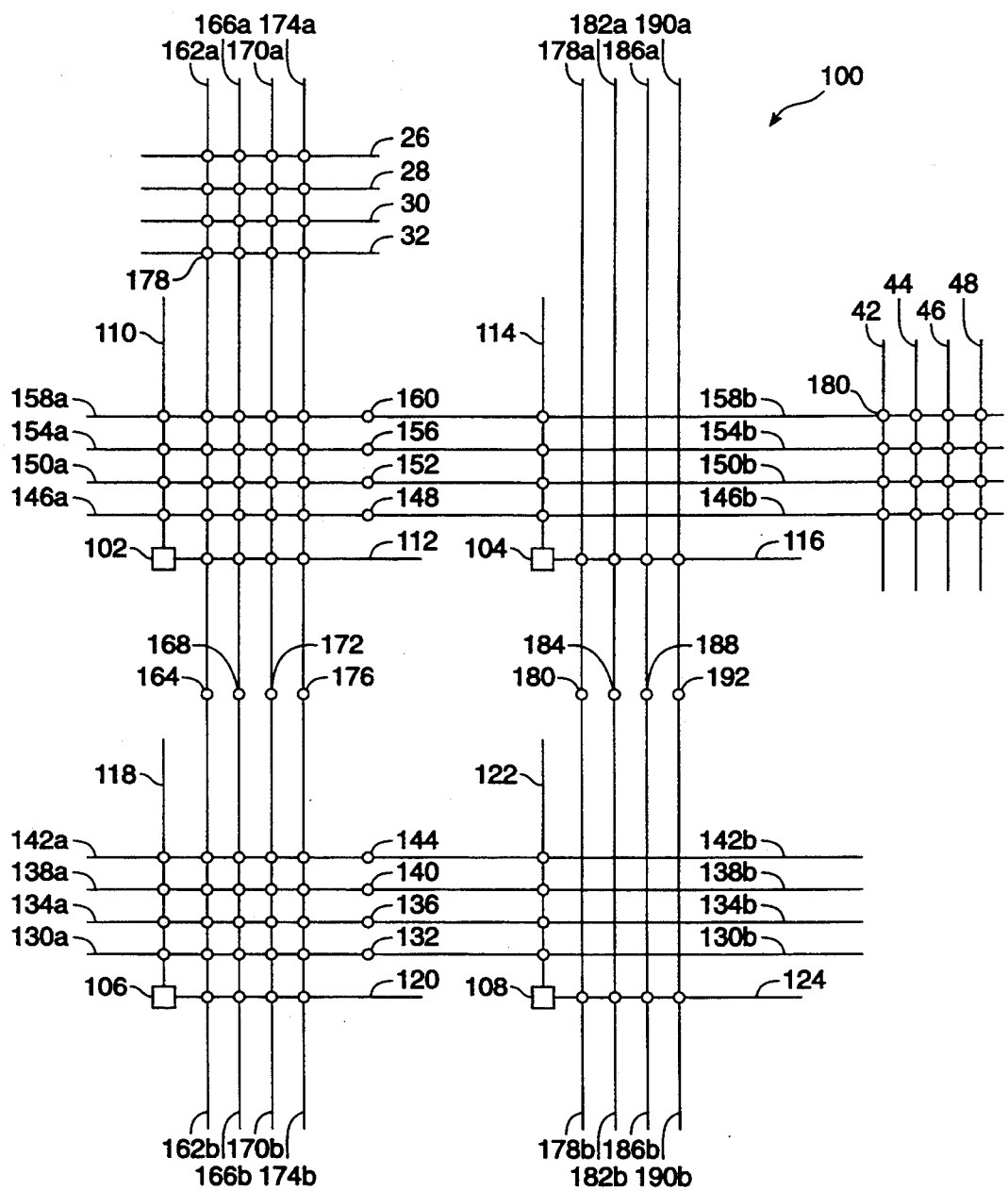
FIG. 4 is a block diagram of a combined high I/O count integrated circuit and programmable interconnect circuit according to a presently preferred embodiment of the invention.

Referring now to FIG. 4, a portion of a programmable interconnect circuit is shown in simplified schematic diagram form. The programmable interconnect circuit of FIG. 4 may be merged with the high I/O count integrated circuit of FIG. 1, or a plurality of such interconnect circuits in MCM form may be placed on a multichip module substrate along with a plurality of MCM integrated circuits such as the one depicted in FIG. 1. Those of ordinary skill in the art will recognize that the architecture of FIG. 4 may be superimposed on the architecture shown in FIG. 1, so that some of the array of low drive I/O pads will be associated with the architecture of FIG. 1 and others will be associated with the architecture of FIG. 4.

illustrative programmable interconnect circuit 100 includes I/O pads 102, 104, 106, and 108, which may be dispersed within the area array of internal I/O connection bumps 62a–62y of FIG. 2. Two pad stubs extend from each of I/O pads 102, 104, 106, and 108. Thus, pad stubs 110 and 112 extend from I/O pad 102; pad stubs 114 and 116 extend from I/O pad 104; pad stubs 118 and 120 extend from I/0 pad 106; and pad stubs 122 and 124 extend from I/O pad 108. The two pad stubs in each pair of pad stubs are preferably oriented orthogonally to one another so as to intersect sets of orthogonally disposed interconnect conductors.

As illustrated in FIG. 4, a set of horizontally disposed interconnect conductors includes four conductors which have been segmented by user-programmable interconnect elements. Thus interconnect conductors 130a and 130b are segmented by user-programmable interconnect element 132. Interconnect conductors 134a and 134b are segmented by user-programmable interconnect element 136. Interconnect conductors 138a and 138b are segmented by user-programmable interconnect element 140. Interconnect conductors 142a and 142b are segmented by user-programmable interconnect element 144. Interconnect conductors 130a, 134a, 138a, and 142a intersect pad stub 118 and interconnect conductors 130b, 134b, 138b, and 142b intersect pad stub 122.

Similarly, interconnect conductors 146a and 146b are segmented by user-programmable interconnect element 148. Interconnect conductors 150a and 150b are segmented by user-programmable interconnect element 152. Interconnect conductors 154a and 154b are segmented by user-programmable interconnect element 156. Interconnect conductors 158a and 158b are segmented by user-programmable interconnect element 160. Interconnect conductors 146a, 150a, 154a, and 158a intersect pad stub 110 and interconnect conductors 146b, 150b, 154b, and 158b intersect pad stub 114.

In the vertical direction, interconnect conductors 162a and 162b are segmented by user-programmable interconnect element 164. Interconnect conductors 166a and 166b are segmented by user-programmable interconnect element 168. Interconnect conductors 170a and 170b are segmented by user-programmable interconnect element 172. Interconnect conductors 174a and 174b are segmented by user-programmable interconnect element 176. Interconnect conductors 162a, 166a, 170a, and 174a intersect pad stub 112 and interconnect conductors 162b, 166b, 170b, and 174b intersect pad stub 120. Similarly, interconnect conductors 178a and 178b are segmented by user-programmable interconnect element 180. Interconnect conductors 182a and 182b are segmented by user-programmable interconnect element 184. Interconnect conductors 186a and 186b are segmented by user-programmable interconnect element 188. Interconnect conductors 190a and 190b are segmented by user-programmable interconnect element 192. Interconnect conductors 178a, 182a, 186a, and 190a intersect pad stub 116 and interconnect conductors 178b, 182b, 186b, and 190b intersect pad stub 124.

Those of ordinary skill in the art will recognize that the particular architecture illustrated in FIG. 4 is only illustrative and that numerous other configurations of numbers of conductors, I/O pads, and user-programmable interconnect elements are possible. The embodiment of FIG. 4 is therefore not to be taken as in any way limiting the scope of the present invention.

The interface between the programmable interconnect circuit of FIG. 4 and the circuit of FIG. 1 may be implemented via the horizontal and vertical interconnect conductors. A plurality of horizontal interconnect conductors 26, 28, 30, and 32 from the architecture of FIG. I are shown connectable to vertical interconnect conductors 162a, 166a, 170a, and 174a through user programmable interconnect elements (only one labeled with reference numeral 178) shown at intersections thereof. In addition, a plurality of vertical interconnect conductors 42, 44, 46, and 48 from the architecture of FIG. 1 are shown connectable to horizontal interconnect conductors 146b, 150b, 154b, and 158bthrough user programmable interconnect elements (only one labeled with reference numeral 180) shown at intersections thereof.

Using the architecture of FIG. 1 in combination with the architecture of FIG. 4 would allow simultaneous use of user-definable function circuits whose inputs and outputs could be connected to one another and to the I/O pads 62a–62y or 74a–74x of FIG. 2. Simultaneously, the architecture of FIG. 4 could be used to route connections into one of the I/O pads 62a–62y or 74a–74x of FIG. 2. and back out through another one either with or without first passing through one or more functional circuit from the architecture of FIG. 1.

The MCM module of the present invention is an array of integrated circuits and programmable interconnect circuits and is a powerful new component for general computation and electronic hardware implementation. This module can implement programmable hardware. By using HDL (Hardware Description Languages) such as VHDL or Verilog HDL, a high level description of the hardware behavior can be described efficiently. Then using synthesis tools the HDL description can be translated into gate implementation for a particular Macro/Gate Library. Then using Partitioning tools, the gate-level description can be mapped into the multiple integrated circuits and programmable interconnect circuit modules. The place & route tools of the integrated circuit and programmable interconnect circuit are then used to provide physical mapping and programming/configuration bits to down load into the programmable hardware module. The programmable hardware is then capable of implementing electronic functions with a lot more concurrency and parallelism than the traditional microprocessor and Von-Neuman serial implementation, and hence is potentially a lot faster. The programming methodology described above is equivalent to programming a microprocessor using a high level language such as a compiler (equivalent to synthesis and partition and Place & route) to generate a executable machine code (equivalent to configuration bits). Thus programmable hardware will replace the Von-Neuman serial computer in many computational and hardware applications requiring higher speed and parallelism.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated circuit disposed on a semiconductor chip having opposing faces, said integrated circuit comprising:

a plurality of functional circuit modules, each of said functional circuit modules including a plurality of inputs and at least one output, said at least one output having a first current drive capability;

a plurality of I/O nodes of a first type, each including a first conductive structure disposed in a first I/O node array on a surface of one of the opposing faces of the semiconductor chip;

a plurality of I/O nodes of a second type, each including a second conductive structure disposed in a second I/O node array on the surface of the one of the opposing faces of the semiconductor chip;

a plurality of output buffers, each of said output buffers including an input and an output, said outputs of individual ones of said output buffers connected to a different one of said I/O nodes of a second type and having a second current drive capability larger than said first current drive capability; and an interconnect architecture including a plurality of conductors superimposed on said functional circuit modules, said interconnect architecture having a plurality of interconnect conductors, selected ones of said interconnect conductors connectable to said inputs and at least one output of selected ones of said functional circuit modules by electrically programmable interconnect elements, selected ones of said interconnect conductors connectable to other selected ones of said interconnect conductors by electrically programmable interconnect elements, selected ones of said interconnect conductors connectable to said first I/O nodes by electrically programmable interconnect elements, and selected ones of said interconnect conductors connectable to the inputs of selected ones of said output buffers by electrically programmable interconnect elements.

2. The integrated circuit of claim 1 wherein said plurality of I/O nodes of a first type and said plurality of I/O nodes of a second type each comprise a plurality of mounting bumps disposed on a surface of one of the opposing faces of the semiconductor chip.

3. A multichip module assembly comprising:

a multichip module substrate including a plurality of external leads;

a plurality of integrated circuits disposed on said multichip module substrate, each of said integrated circuits disposed on a semiconductor chip including opposing faces and having a plurality of functional circuit modules, each of said functional circuit modules having inputs and at least one output, said at least one output having a first current drive capability, a plurality of I/O nodes of a first type, each having a first conductive structure disposed in a first I/O node array on a surface of one of said opposing faces of said semiconductor chip, a plurality of I/O nodes of a second type, each having a second conductive structure disposed in a second I/O node array on said surface of said one of said opposing faces of said semiconductor chip, a plurality of output buffers, each of said output buffers having an input and an output, said outputs of individual ones of said output buffers connected to a different one of said I/O nodes of a second type and having a second current drive capability larger than said first current drive capability, an interconnect architecture having a plurality of conductors superimposed on said functional circuit modules, said interconnect architecture having a plurality of interconnect conductors, selected ones of said interconnect conductors connectable to said inputs and at least one output of selected ones of said functional circuit modules by electrically programmable interconnect elements, selected ones of said interconnect conductors connectable to other selected ones of said interconnect conductors by electrically programmable interconnect elements, selected ones of said interconnect conductors connectable to said first I/O nodes by electrically programmable interconnect elements, and selected ones of said interconnect conductors connectable to the inputs of selected ones of said output buffers by electrically programmable interconnect elements;

a plurality of first conductive traces disposed in said multichip module substrate, individual ones of said first conductive traces connected between selected ones of said plurality of I/O nodes of a first type and said plurality of I/O nodes of a second type of said integrated circuits; and a plurality of second conductive traces disposed in said multichip module substrate, individual ones of said second conductive traces connected between selected ones of said plurality of I/O nodes of said second type of said integrated circuits and said external leads.

4. The multichip module assembly of claim 3, further comprising a plurality of programmable interconnect structures disposed on said multichip module substrate, each of said programmable interconnect structures including a plurality of input/output connections, and each one of said programmable interconnect structures further including connecting means for connecting together selected ones of said input/output connections, each one of said connecting means associated with a group of said integrated circuits by conductive traces disposed in said multichip module substrate connected between selected ones of input/output nodes of said programmable interconnect structures and selected ones of said plurality of I/O nodes of a first type of each of its associated group of integrated circuits.

* * * * *